(12) United States Patent
Cheng et al.

(10) Patent No.: US 12,492,468 B2
(45) Date of Patent: Dec. 9, 2025

(54) SACVD SYSTEM AND METHOD FOR REDUCING OBSTRUCTIONS THEREIN

(71) Applicant: Taiwan Semiconductor Manufacturing Company, LTD., Hsinchu (TW)

(72) Inventors: Kuang-Wei Cheng, Hsinchu (TW); Cheng-Lung Wu, Zhunan (TW); Chyi-Tsong Ni, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 431 days.

(21) Appl. No.: 17/674,160

(22) Filed: Feb. 17, 2022

(65) Prior Publication Data

US 2023/0151484 A1     May 18, 2023

Related U.S. Application Data

(60) Provisional application No. 63/279,897, filed on Nov. 16, 2021.

(51) Int. Cl.
    *C23C 16/44*          (2006.01)
    *C23C 16/40*          (2006.01)
    *H01L 21/02*          (2006.01)

(52) U.S. Cl.
    CPC ........ *C23C 16/4412* (2013.01); *C23C 16/401* (2013.01); *H01L 21/02164* (2013.01); *H01L 21/02271* (2013.01); *H01L 21/02211* (2013.01)

(58) Field of Classification Search
    CPC .......... C23C 16/4412; B01J 2219/0869; B01J 2219/0875; F01N 2370/22
    See application file for complete search history.

(56) References Cited

U.S. PATENT DOCUMENTS

| | | | |
|---|---|---|---|
| 2004/0079060 A1* | 4/2004 | Alward | C03C 13/00 55/523 |
| 2009/0275183 A1* | 11/2009 | Mine | H10D 30/601 257/E21.135 |
| 2011/0311725 A1* | 12/2011 | Sneh | C23C 16/402 423/407 |
| 2017/0140920 A1* | 5/2017 | Arnepalli | H01L 21/30621 |
| 2018/0096840 A1* | 4/2018 | Jeong | H10D 86/0231 |
| 2019/0122872 A1* | 4/2019 | Ghosh | C23C 16/4408 |
| 2019/0282948 A1* | 9/2019 | Mahawili | B01D 53/78 |
| 2019/0371574 A1* | 12/2019 | Hsieh | H01J 37/32422 |
| 2021/0051771 A1* | 2/2021 | Fuse | H01L 21/67115 |
| 2023/0219052 A1* | 7/2023 | Mcenaney | B01D 53/185 71/58 |

FOREIGN PATENT DOCUMENTS

| | | | | |
|---|---|---|---|---|
| CA | 3167076 A1 * | 8/2021 | ............... | G21B 1/05 |
| WO | WO-2019125933 A1 * | 6/2019 | ......... | C23C 16/4481 |

\* cited by examiner

*Primary Examiner* — Edward Chin
(74) *Attorney, Agent, or Firm* — Lippes Mathias LLP

(57) ABSTRACT

Systems and methods for reducing obstructions in an exhaust line of a sub-atmospheric chemical vapor deposition (SACVD) system are disclosed. Such obstruction may occur due to the reaction of a silicon precursor with ozone, which forms solid particles in the exhaust line. A catalytic apparatus is provided which catalyzes the decomposition of ozone ($O_3$) to oxygen ($O_2$). Due to the lower reactivity of $O_2$, the formation of solid particles is reduced.

20 Claims, 7 Drawing Sheets

SACVD SYSTEM AND METHOD FOR REDUCING OBSTRUCTIONS THEREIN

BACKGROUND

In the manufacture of integrated circuits on semiconductor wafers, one fabrication process used is sub-atmospheric pressure chemical vapor deposition (SACVD). Selected gases are inputted to a reaction chamber for the deposition of oxide insulating layers. Chemical byproducts and unreacted gases (i.e. exhaust gases) are then removed from the chamber using, for example, an exhaust pump.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A shows a hexagonal cross-section.

FIG. 3B shows a triangular cross-section.

FIG. 3C shows a rectangular cross-section.

FIG. 3D shows a circular cross-section.

FIG. 3E shows a cross-section with a series of straight walls provided within a circular wall.

FIG. 3F shows a cross-section formed from four octagons surrounding a square.

FIG. 3G shows a rectangular cross-section divided into four triangular-shaped passages.

FIG. 3H shows a rectangular cross-section divided into eight triangular-shaped passages.

DETAILED DESCRIPTION

Figure 1:
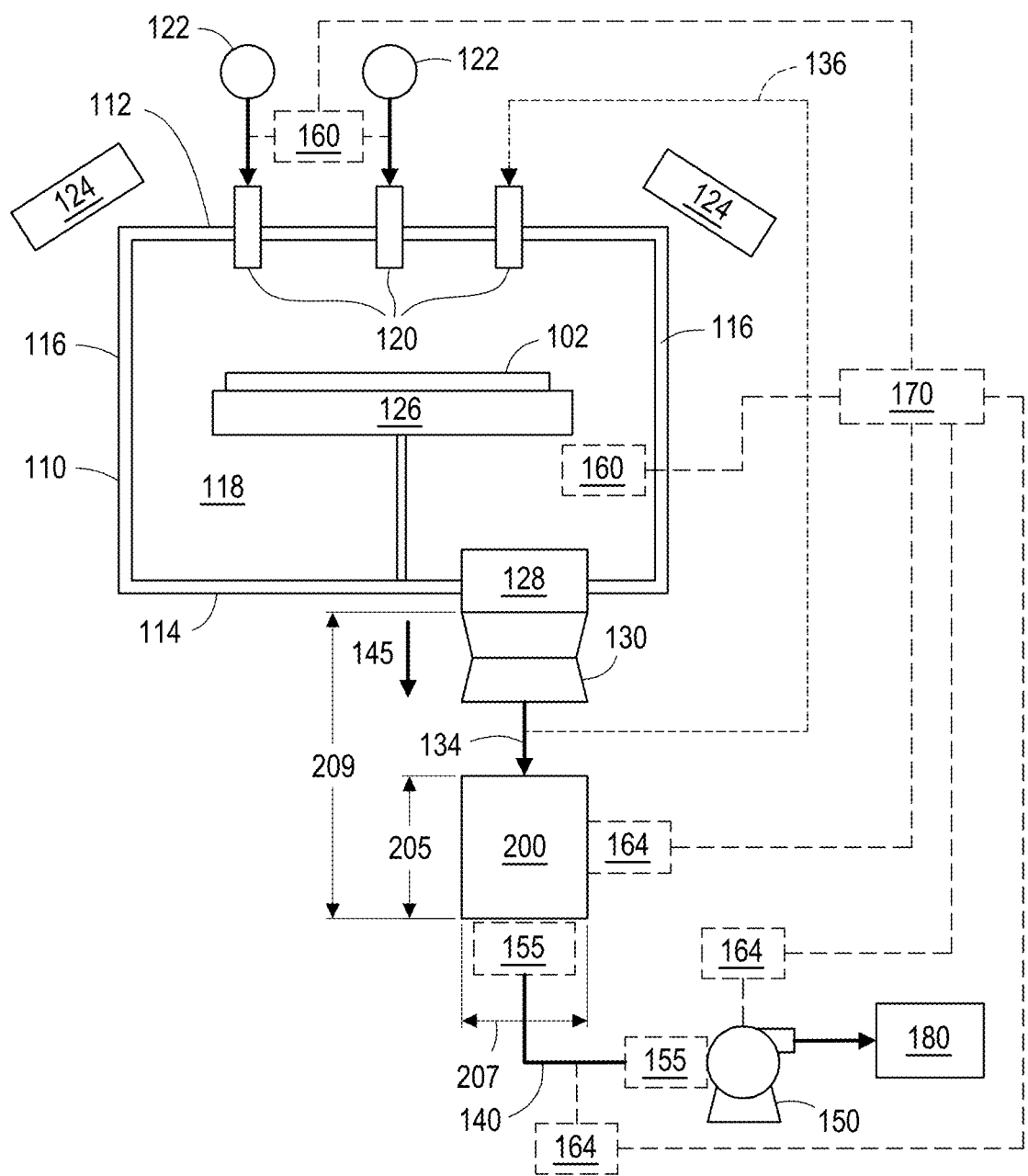
FIG. 1 is a diagram of an SACVD system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Similarly, the terms "inlet" and "outlet" are relative to a fluid flowing through them with respect to a given structure, e.g. a fluid flows through the inlet into the structure and flows through the outlet out of the structure. The terms "upstream" and "downstream" are also relative to the direction in which a fluid flows through various components, i.e. the flow fluids through an upstream component prior to flowing through the downstream component.

The term "fluidly connected" is used in the specification to indicate that two components are connected to each other in such a way that a fluid in one component would eventually reach the second component. This term permits other structures and components to be present between the two fluidly connected components.

Numerical values in the specification and claims of this application should be understood to include numerical values which are the same when reduced to the same number of significant figures and numerical values which differ from the stated value by less than the experimental error of conventional measurement technique of the type described in the present application to determine the value. All ranges disclosed herein are inclusive of the recited endpoint.

The present disclosure may refer to temperatures for certain method steps. It is noted that these references are usually to a temperature measured in the given environment, or set as the desired goal in the given environment, and do not require that temperature to be attained by any particular material within the given environment.

The term "oxygen" may be used herein to refer to both an oxygen atom or to the dioxygen ($O_2$) molecule, and the meaning is believed to be clear based on the context.

In some particular embodiments, sub-atmospheric pressure chemical vapor deposition (SACVD) is used to form silicon oxide ($SiO_x$) insulating layers of an integrated circuit on a semiconductor wafer substrate. A silicon-containing source gas acts as a silicon precursor, providing silicon for the reaction. Examples of such silicon precursors include but are not limited to tetraethyl orthosilicate (TEOS), trimethylsilane, tetramethylsilane, and hexachlorodisilane (HCDS). Ozone ($O_3$) is used to provide oxygen atoms for the reaction. At temperatures of about 300° C. to about 500° C. or higher, these gases will react to deposit silicon oxide. However, only a small percentage of the gases will actually react in the reaction chamber. As a result, the exhaust gases still contain reactive gases/molecules, and the exhaust gases are typically at a temperature high enough for reaction to continue occurring (for example between TEOS and ozone) in the exhaust line and the pump. The resulting deposits of powder ($SiO_x$) can build up and trip operational alarms, cause partial or full obstruction of the exhaust line and the pump, interfere with normal operation (e.g. increased downtime due to maintenance), and shorten the useful life of the pump. It is also possible for the powder to move back into the chamber and contaminate the wafer substrate, reducing yield and requiring early maintenance.

The present disclosure thus relates to methods and systems for reducing the amount of powder that can build up in the exhaust line and pump. Very generally, the methods and systems include a catalytic apparatus that decomposes ozone ($O_3$) to oxygen ($O_2$). Oxygen ($O_2$) is much less reactive than ozone, and so the formation of silicon oxides within the exhaust line and pump is greatly reduced. In addition, the TEOS will remain in the gaseous phase and so will not condense in the exhaust line or pump (which would also create problems).

FIG. 1 is an illustrative diagram of an SACVD system of the present disclosure, in accordance with some embodiments. The system 100 includes a reaction chamber 110 having a top wall 112, a bottom wall 114, and side walls 116 that define an internal volume 118 of the reaction chamber. The reaction chamber 110 also includes one or more gas inlets 120 for the silicon source gas, $O_3$, and any other desirable gases. The gas inlets 120 are fluidly connected to gas sources 122 for providing the specified gas. It is noted that, for example, the silicon source gas and the $O_3$ may be mixed with carrier gases such as, for example, helium ($H_2$) or dioxygen ($O_2$).

The internal volume of the reaction chamber is heated to maintain the reaction gases (silicon precursor gas and ozone) in a gaseous state. This may be done, for example, by using heat lamps 124 or other radiant or convective heat sources. These heat sources may be located within the reaction chamber or its walls, or may be located external to the reaction chamber. For example, the walls of the reaction chamber could be made of a transparent heat-retaining material such as quartz.

Also included is a substrate support 126 within the reaction chamber, for supporting a semiconductor wafer substrate during the SACVD process. Also illustrated is a wafer substrate 102. In some embodiments, the substrate support may be an electrostatic chuck which uses electrostatic force to secure the wafer substrate. The substrate support may be rotatable in some embodiments, and may be configured to move up and down in other embodiments. For example, a lower position of the substrate support may be used for loading/unloading the wafer substrate. A raised position of the substrate support may be used to bring the substrate into a more suitable position for performing a processing step. For example, if the process gas inlets are located near the top wall, the raised position may place the substrate closer to the gas inlets. It is also noted that while only one substrate support is illustrated, any number of substrate supports may be present, so that multiple wafer substrates can be treated at a time.

An exhaust port 128 is also present in the SACVD system for removing various gases from the reaction chamber. The exhaust port is also used to reduce the pressure within the reaction chamber. The exhaust port 128 includes a throttle valve 130 which is fluidly connected to an exhaust line 140. A pump 150 is fluidly connected to the exhaust line. The gas inlets and the exhaust port are typically located on different walls of the chamber. Various process sensors 160 may be present within the reaction chamber (for example, thermometer, pressure gauge, and/or flow meter).

A controller 170 may be used to receive input from the sensors 160 to control the various gas flows, pressures, and temperatures to optimize the deposition process upon the semiconductor wafer substrate. The controller may be implemented on one or more general purpose computers, special purpose computer(s), a programmed microprocessor or microcontroller and peripheral integrated circuit elements, an ASIC or other integrated circuit, a digital signal processor, a hardwired electronic or logic circuit such as a discrete element circuit, a programmable logic device such as a PLD, PLA, FPGA, Graphical card CPU (GPU), or PAL, or the like. Such devices typically include at least memory for storing a control program (e.g. RAM, ROM, EPROM) and a processor for implementing the control program.

The throttle valve 130 at the exhaust port is used to control the flow of exhaust gases out of the reaction chamber. The throttle valve 130 leads to the catalytic apparatus 200 where ozone is decomposed to oxygen. As illustrated here, there may be a short line 134 between the throttle valve 130 and the catalytic apparatus 200. Desirably, there are no turns in the short line, to avoid a potential powder buildup location upstream of the catalytic apparatus. However, it is noted that the presence of the short line is optional, and the throttle valve may be directly connected to the catalytic apparatus if desired.

If desired, a recycle line 136 may be present for recycling some of the exhaust gases back into the reaction chamber after exiting through the throttle valve, but prior to passing through the catalytic apparatus. In other words, the recycling occurs upstream of the catalytic apparatus.

The exhaust line 140 is downstream of the catalytic apparatus 200, and is illustrated as having a turn. A pump 150 is fluidly connected to the exhaust line 140. Put another way, the catalytic apparatus 200 is fluidly connected to both the exhaust port 128 and the exhaust line 140, or in other words is located between the exhaust port and the exhaust line. Sensors 164 may also be present within the catalytic apparatus, downstream in the exhaust line, and in the pump to measure ozone concentrations. These sensors may also provide input to the controller 170. Also illustrated here is an optional physical filter 155 which located upstream of the pump. Two different locations are illustrated for the optional physical filter, at either end of the exhaust line 140.

Finally, downstream of the pump 150 is a waste treatment system 180 which is used to treat the residues of the system. The waste treatment system may include an incinerator in which the exhaust gases are further heated to cause decomposition of the various materials in the exhaust gases. The waste treatment system may also include a scrubber, such as a wet scrubber which mixes the exhaust gases with water to precipitate materials into solids or to produce other materials which can be more easily treated or disposed of. For example, TEOS can be hydrolyzed into ethanol and silicic acid, which can be incinerated or released to waste water.

The various components of the reaction chamber and the SACVD system can be made as desired from conventional materials, such as plastics and/or metals. The various components and their shapes and sizes can be made using conventional manufacturing techniques.

Referring still to FIG. 1, the catalytic apparatus 200 itself has a height 205 and a width 207. In particular embodiments, the width of the catalytic apparatus is less than the height of the catalytic apparatus. The cross-section of the catalytic apparatus, when viewed along a vertical axis 145, may be any suitable shape, such as a rectangle, a circle, a hexagon, etc. The distance between the exhaust port and the end of the catalytic apparatus is desirably as short as possible, and in particular embodiments is less than 10 meters. This distance is indicated with reference numeral 209.

It is noted that the reaction chamber of the SACVD system is used to deposit material on a semiconductor wafer substrate. The SACVD system is also configured to perform cleaning processes to remove films or residues which may be deposited or arise on the interior walls of the reaction chamber. Such cleaning processes may require the use of various gases and/or liquids, and it should be understood that elements related to those cleaning processes are not illustrated in FIG. 1 and are omitted for simplicity and clarity.

Continuing, the catalytic apparatus contains a catalyst that decomposes ozone ($O_3$) to oxygen ($O_2$). In particular embodiments, the catalyst is present in the form of a coating on the walls of a cartridge that is inserted into the catalytic apparatus. It is contemplated that the cartridge is removable and replaceable, and can be replaced when the catalytic activity is reduced below desirable operating values.

Figure 2:
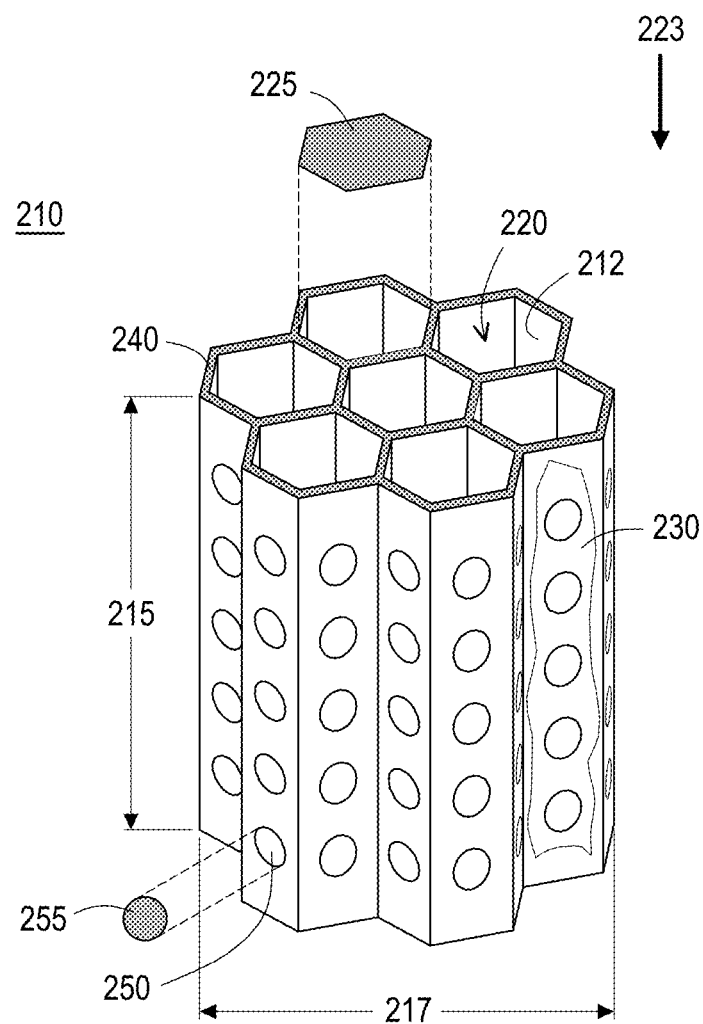
FIG. 2 is a diagram of a catalytic cartridge for use in the catalytic apparatus of the SACVD system, in accordance with some embodiments.

FIG. 2 is an illustration of such a cartridge 210, in accordance with some embodiments of the present disclosure. The cartridge 210 is formed from a plurality of walls 212 which together form passages 220. The cartridge has an overall height 215 and an overall diameter 217 which is sized to fit within the catalytic apparatus 200. In particular embodiments, the diameter 217 of the cartridge is less than the height of the cartridge 215. In some further particular embodiments, the height of the cartridge is from about 10 millimeters (mm) to about 200 mm. The height of the cartridge is related to the size of the catalytic area and the residence time of exhaust gases within the catalytic apparatus. Too short a height would result in insufficient amounts of ozone being decomposed. Too tall a height affects the ability of the catalytic apparatus to be retrofitted into existing SACVD systems. However, the cartridge may have other dimensions or configurations as well.

In particular embodiments, the components of the system are sized and/or the system is operated such that the residence time of the exhaust gases within the catalytic apparatus is less than one second. It has been found that a residence time of less than 0.1 seconds is sufficient to reduce the ozone concentration from about 10% upstream of the catalytic apparatus to less than 3% downstream of the catalytic apparatus in the exhaust line.

As illustrated here, the cross-sectional area 225 of each passage 220 has the shape of a hexagon, with each passage being formed from the combination of six walls. When viewed head-on in the direction indicated by arrow 223, a vertical opening ratio is defined by the open area of each passage divided by the total area of the cartridge (or in other words including the area taken up by the walls). In particular embodiments, the vertical opening ratio is at least 95%. Generally, a higher vertical opening ratio is desired to avoid a large pressure drop within the catalytic apparatus. In addition, the passages should generally be open, or in other words no obstructions should be present within the passages. This also avoids a large pressure drop.

Continuing, the catalyst is present as a coating 230 on the walls. In particular embodiments, the catalyst is an oxide of manganese (Mn), titanium (Ti), zinc (Zn), or iron (Fe), and combinations thereof. Specific examples of such catalysts may include MnO, TiO, ZnO, FeO, $Fe_2O_3$, $TiO_2$, and $MnO_2$. In other additional embodiments, the catalyst may be the metal or an oxide of platinum (Pt), palladium (Pd), ruthenium (Ru), copper (Cu), tungsten (W), silver (Ag), tin (Sn), nickel (Ni), gold (Au), iridium (Ir), rhenium (Rh), cerium (Ce), chromium (Cr), cobalt (Co), aluminum (Al), vanadium (V), molybdenum (Mo), magnesium (Mg), or zirconium (Zr), or combinations thereof. Specific examples of such catalysts may include $Cu_2O$, CuO, $Ag_2O$, AgO, $Ni_2O_3$, $Au_2O_3$, colloidal Pt, $ZrO_2$, $Co_3O_4$, NiO, $Cr_2O_3$, $CeO_2$, MgO, $V_2O_5$, and $MoO_3$. The coating is contemplated to be present on both the inner surface and the outer surface of each wall The walls of the cartridge may act as solid supports for the catalyst. The walls can be made of any suitable paper, plastic, or metal which can withstand the temperatures of the exhaust gases exiting the reaction chamber of the SACVD system. In some embodiments, the cartridge includes a frame 240 which is used to support the walls. When used, the frame is generally made of a different material from the walls, and is more rigid than the walls. The frame is illustrated here in the form of a support structure at one end of the cartridge, which may also be present at both ends of the cartridge. Support bars may run between the support structures. The frame may also be made from any suitable material.

Continuing, as illustrated in FIG. 2, in some embodiments, one or more walls 212 of the cartridge include at least one perforation or hole(s) 250 along the height 215 thereof. The presence of such holes increases the reaction area, and may also create turbulence within the gas flow that enhances contact of $O_3$ with the walls to increase decomposition. Holes are illustrated here as being only on the outer walls of the cartridge, but they may also be present on the inner walls of the cartridge. In particular embodiments, the cross-sectional area 255 of each hole is less than the cross-sectional area 225 of the passage. In addition, in particular embodiments, adjacent holes are separated by at least 1 mm, although other separation distances are also contemplated. This increases the structural strength of the wall. The shape of the hole is not significant. For example, the hole(s) may be in the shape of a circle, triangle, rectangle, or hexagon, or any other desired shape.

When viewing the surface area of the wall, a hole ratio is defined by the total open area of the wall (i.e. the sum of all holes) divided by the total surface area of the wall. In particular embodiments, the hole ratio is less than 75%. If the hole ratio is too high, then there becomes insufficient surface area for the catalyst, resulting in reduced decomposition of ozone ($O_3$) to oxygen ($O_2$). In addition, the generated turbulence might also be reduced to undesirably low levels. It is emphasized that the presence of holes is optional, or put another way the hole ratio may be zero.

It is contemplated that the cartridge fits snugly within the catalytic apparatus, or put another way that the catalytic apparatus and the cartridge have substantially the same height. The catalytic apparatus and the cartridge may have different widths/diameters. For example, the catalytic apparatus may require some volume for a door to access the cartridge, or to include sensors 164 within the catalytic apparatus. It should also be noted that exhaust gases may also pass between the outer walls of the cartridge and the walls of the catalytic apparatus itself.

The cross-sectional shape of the passage 220 within the cartridge is not significant. For example, FIGS. 3A-3H illustrate different cross-sectional shapes for the passage. Generally speaking, these different shapes may provide different ratios of surface area to volume for a given height.

Figure 3A:
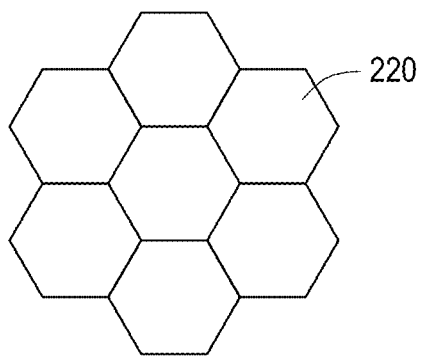
FIGS. 3A-3H are illustrations of different cross-sectional shapes for the cartridge, in accordance with some embodiments.
Figure 3B:
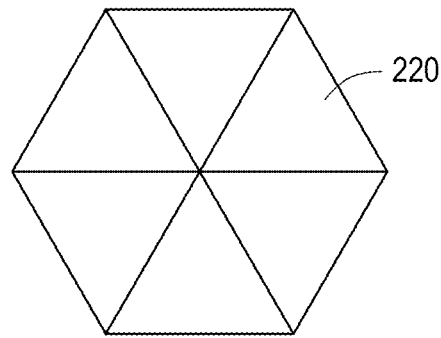
Figure 3C:
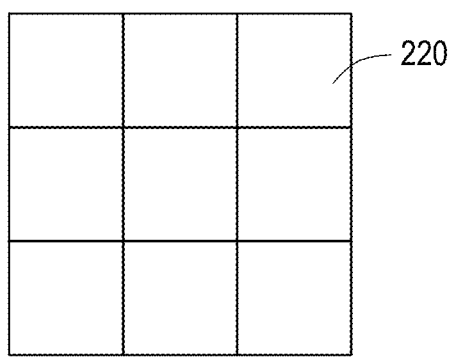
Figure 3D:
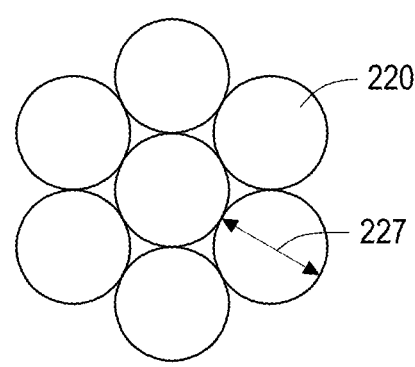

FIG. 3A illustrates a cartridge where the passages have a hexagonal shape. In FIG. 3B, each passage has a triangular shape formed from three walls. FIG. 3C illustrates passages with a rectangular (e.g. square) shape formed from four walls. FIG. 3D illustrates passages having a circular shape, formed from one wall.

Figure 3E:
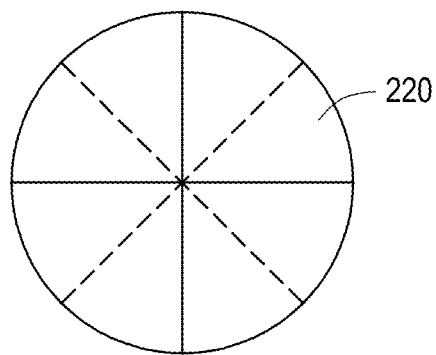
Figure 3F:
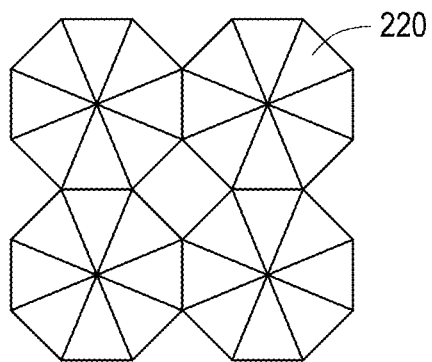
Figure 3G:
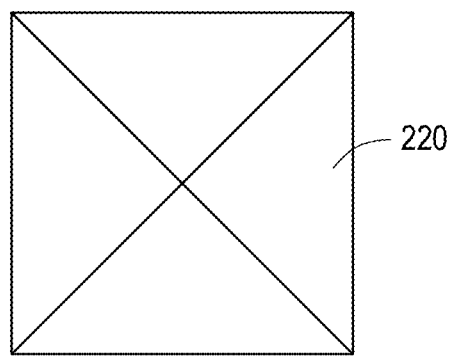
Figure 3H:
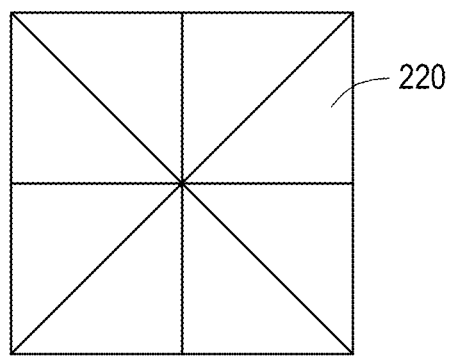

The cartridges of FIGS. 3E-3H can be described as having a cross-section made from a combination of different shapes. In FIG. 3E, a series of straight walls are provided within a circular wall, created a series of wedge-shaped passages. For example, there may be four straight walls (solid line) or eight straight walls (including dotted line) passing through the center of the circle. In FIG. 3F, the cartridge is formed from four octagons surrounding a square. Each octagon is further divided into eight smaller triangles. In FIG. 3G, a rectangular (e.g. square) wall is divided into four triangular-shaped passages, and in FIG. 3H the rectangular wall is divided into eight triangular-shaped passages.

Referring now to FIG. 3D, each passage 220 has a diameter 227. In particular embodiments, the diameter of the passage is from about 5 millimeters to about 100 millimeters, although other diameters can be used as well. For passages that do not have a circular cross-section, the diameter can be calculated as the equivalent diameter of a circle that has the same cross-sectional area of the non-circular passage. The diameter of the passage is related to the vertical opening ratio, the total surface area of the passage, and the overall catalytic ability of the cartridge/catalytic apparatus.

Figure 4:
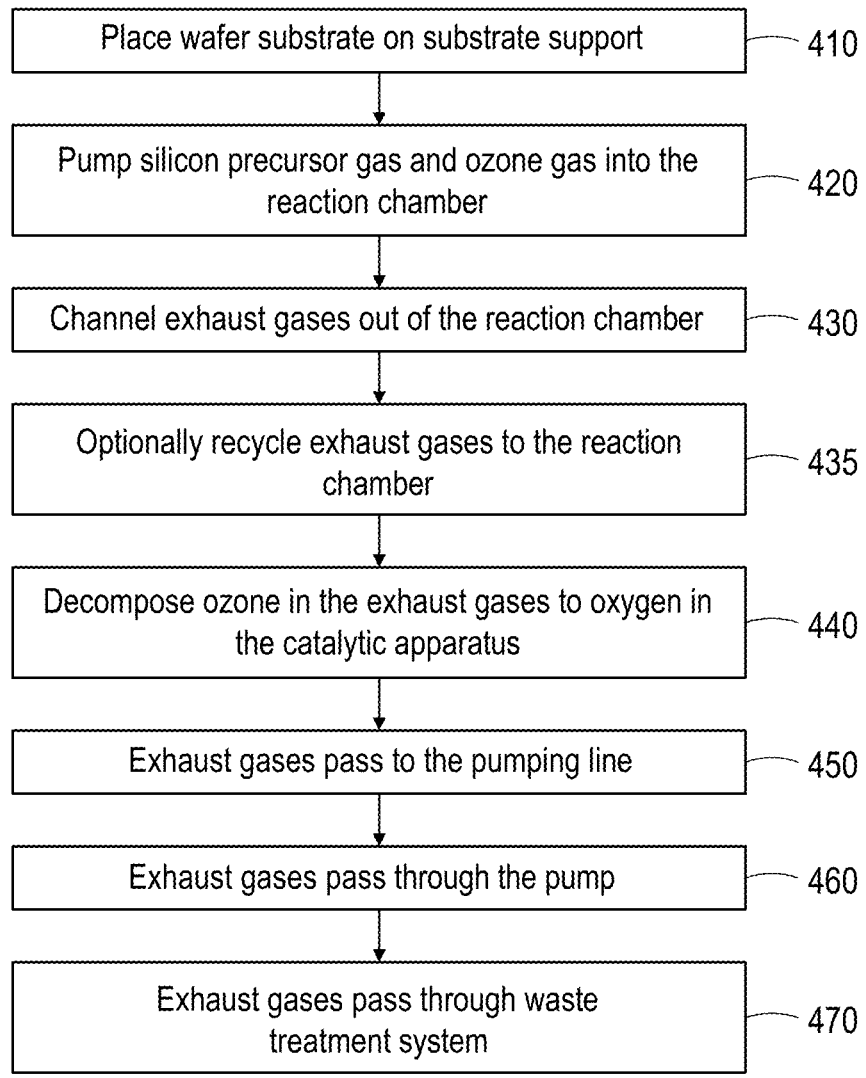
FIG. 4 is a flowchart showing a method of using the SACVD system, in accordance with some embodiments.

FIG. 4 illustrates a method of using the SACVD system, in accordance with some embodiments, to hinder or reduce clogging in an exhaust line and to reduce the formation of silicon dioxide in the exhaust line. The various method steps are also described with reference to FIG. 1.

Starting with step 410, a semiconductor wafer substrate 102 is placed upon the substrate support 126. The substrate can be, for example, a wafer made of silicon, germanium arsenide (GaAs), or gallium nitride (GaN), or some other suitable material. In particular embodiments, the methods described in the present disclosure use silicon wafers as the substrate.

In particular embodiments, the substrate support is an electrostatic chuck, which contains integral electrodes under a surface. The electrodes are biased with high voltage to establish an electrostatic holding force between the surface and the wafer substrate. In some embodiments, the substrate support may also contain radiant heaters, for heating the substrate.

Next, in step 420, a silicon precursor gas and ozone gas are pumped into the reaction chamber 110. The reaction chamber may be operated at a pressure of about 10 kPa to about 95 kPa (for comparison, atmospheric pressure is ~101 kPa). The silicon precursor gas, for example tetraethyl orthosilicate or TEOS, may be pumped in at a flow rate of about 1600 to about 2400 standard cubic centimeters per minute (sccm), or any other appropriate flow rate. The ozone may be pumped into the reaction chamber at a concentration of about 8 to about 14 mole % in a carrier gas (e.g. $He_2$) at a flow rate of about 3000 to about 5000 sccm, although any other appropriate concentration or flow rate may be used. An excess of oxygen should be provided relative to silicon, for example a molar ratio of about 2 to about 20.

The reaction chamber may be operated so that a temperature of about 300° C. to about 500° C. is attained on or near the surface of the semiconductor wafer substrate, i.e. including the gaseous environment within the reaction chamber. At these temperatures, the silicon precursor gas and the ozone will react to form insulating silicon oxides ($SiO_x$), such as silicon dioxide, upon the semiconductor wafer substrate.

As illustrated in step 430, exhaust gases are continuously channeled out of the reaction chamber. Referring to FIG. 1, the flow of the exhaust gases is controlled by the throttle valve 130, and the exhaust gases flow out of the reaction chamber 110, optionally through the short line 134 when present, and into the catalytic apparatus 200. The exhaust gases include unreacted silicon precursor gas and unreacted ozone, carrier gas, and may also include other chemical byproducts. In particular embodiments, the concentration of the ozone in the exhaust gases is greater than 10 mole %.

In optional step 435, some of the exhaust gases are recycled back to the reaction chamber. This is illustrated in FIG. 1 as recycle line 136. This may increase the overall efficiency of the reaction chamber, by permitting additional reaction of the unreacted silicon precursor gas and unreacted ozone that was present in the exhaust gases.

The exhaust gases still contain reactive compounds, and it is desired to reduce or prevent their reaction. Thus, in step 440, the catalytic apparatus 200 receives the exhaust gases and decomposes the ozone ($O_3$) to oxygen ($O_2$) upstream of the exhaust line 140, or in other words prior to the exhaust gases entering the exhaust line. This reduces the formation of powder further downstream of the catalytic apparatus by reducing/removing the amount/concentration of one of the required reactants.

Continuing, in step 450, the exhaust gases pass from the catalytic chamber into/through the exhaust line. In particular embodiments, the temperature of the exhaust gases within the exhaust line is from about 60° C. to about 200° C. Desirably, the temperature of the exhaust gases is greater than the boiling point of TEOS (~168° C.), so that the TEOS remains in its gaseous form and does not condense within the exhaust line. In particular embodiments, the ozone concentration in the exhaust gases downstream of the catalytic apparatus is less than 3 mole %. As a result, powder formation is heavily reduced in the exhaust line and the pump, due to the lower reactivity of TEOS with oxygen ($O_2$).

Continuing, in step 460, the exhaust gases pass through the pump. Again, a heavily reduced amount of powder may be produced within the pump. Finally, in step 470, the exhaust gases pass through the waste treatment system.

While the catalytic apparatus reduces the amount of powder that is formed in the exhaust line and the pump, additional measures can be taken to increase the lifetime of these components. For example, referring to FIG. 1, the exhaust gases may pass through a physical filter 155 prior to entering the pump 150. Such a physical filter might take the form of, for example, a cylindrical bag made of high-temperature fabric which acts as a filter medium. The exhaust gases pass through the bag, either from the inside to the outside or vice versa, causing any powder in the exhaust gases to accumulate on the bag. The bag may also provide a surface upon which reactive gases can precipitate. Other filtration media are known, such as a pleated filter, and may be used as well. Due to buildup on the filter, a pressure drop occurs. When a sufficiently large pressure drop is registered, the filter can be cleaned using methods such as mechanical shaking of the filter, or by pulsing a jet of compressed air to flex the filter surface and dislodge any powder, or by reversing gas flow through the bag. This physical filter would provide some control of the location in which any powder buildup occurs, which may aid in ease of maintenance.

Figure 5:
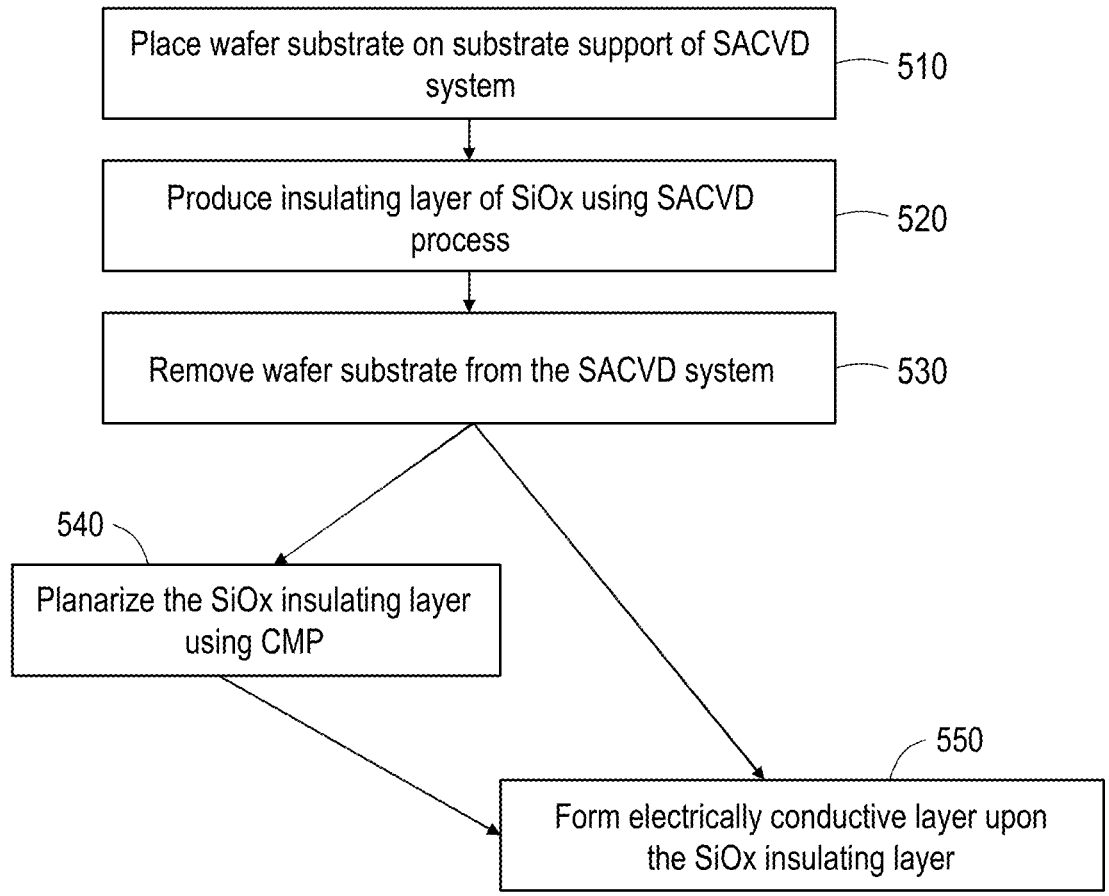
FIG. 5 is a flowchart showing a method of processing a semiconductor wafer substrate using the SACVD system, in accordance with some embodiments.

FIG. 5 illustrates a method of processing a semiconductor wafer substrate. Starting with step 510, the semiconductor wafer substrate is placed upon the substrate support of an SACVD system. Next, in step 520, an SACVD process is used to produce an insulating layer of silicon oxide ($SiO_x$), such as silicon dioxide, on the wafer substrate. Next, in step 530, the wafer substrate is removed from the SACVD system. Two examples of further processing the wafer substrate are illustrated. In step 540, the insulating layer of silicon oxide is planarized using a chemical mechanical polish (CMP) process. Alternatively or in addition, in step 550, an electrically conductive layer is formed upon the insulating layer of silicon oxide.

Figure 6:
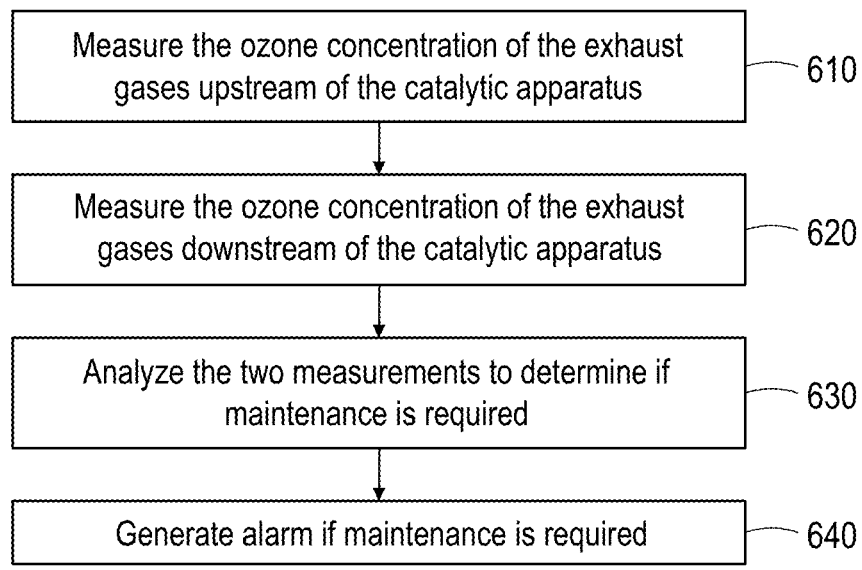
FIG. 6 is a flowchart showing a method for maintaining the catalytic apparatus of the SACVD system, in accordance with some embodiments.

FIG. 6 illustrates a method for maintaining the catalytic apparatus. In step 610, the ozone concentration of the exhaust gases is measured prior to entering the catalytic apparatus, i.e. upstream of the catalytic apparatus. In step 620, the ozone concentration of the exhaust gases is measured after exiting the catalytic apparatus, i.e. downstream of the catalytic apparatus. In step 630, these measurements are analyzed to determine if maintenance is required. In some embodiments, if the ozone concentration downstream of the catalytic apparatus is above a threshold value, then an alarm is generated indicating the catalyst cartridge in the catalytic apparatus needs to be serviced or replaced. In some other embodiments, if the percentage decrease between the ozone concentration upstream of the catalytic apparatus and the ozone concentration downstream of the catalytic apparatus is below a threshold value, then the same alarm is generated. Either condition indicates the catalyst is no longer successfully converting ozone ($O_3$) to oxygen ($O_2$). The generation of the alarm is indicated as step 640.

The ozone concentration can be measured using an ozone analyzer. Such an analyzer operates by first drawing the ambient air in through a sampler inlet. A filter may be used to remove particles prior to sending the air sample to the ozone analyzer. The air sample is then split into two parts, Part A and Part B. Part A is the ambient air, and is not processed. Part B is processed to remove all ozone, and provide a baseline. Continuing, ozone has a peak absorption wavelength of about 254 nm. Both Part A and Part B are exposed to 254 nm light and the intensity of the light that passes through each part is measured. The ratio of the light intensity between the two parts is used to determine the ozone concentration.

The SACVD systems of the present disclosure can form different structures used in integrated circuits. Silicon oxide produced using SACVD can be used to fill trenches between adjacent semiconductor devices in a process known as shallow trench isolation (STI). Silicon oxide can also be used as a dielectric in capacitors and transistors, or as an intermetal dielectric between metal lines, or to form trenches for damascene metallization. Silicon oxide can also be used as a thermal insulator and as a mask for common diffusing species.

By including the catalytic apparatus between the reaction chamber and the exhaust line, the continued reaction of gases and resulting formation of powder is heavily reduced. This reduces clogging in the exhaust line and in the pump, which can increase the service lifetime of the pump. In addition, the tripping of operational alarms related to the pump is also reduced, which increases operational uptime.

Some embodiments of the present disclosure thus relate to methods of forming a silicon oxide insulating layer on a semiconductor wafer substrate. A silicon precursor is reacted with ozone in a reaction chamber of a sub-atmospheric chemical vapor deposition (SACVD) system to form the silicon oxide insulating layer on the semiconductor wafer substrate. Exhaust gases from the reaction chamber are channeled through a catalytic apparatus prior to the exhaust gases entering the exhaust line. The catalytic apparatus contains a catalyst that decomposes ozone to oxygen.

Some embodiments of the present disclosure also relate to a system for a sub-atmospheric chemical vapor deposition (SACVD) process. The system includes a reaction chamber that includes an exhaust port. The system also includes an exhaust line for removing exhaust gases through the exhaust port. A catalytic apparatus is positioned between the exhaust port and the exhaust line. The catalytic apparatus contains a catalyst that decomposes ozone to oxygen.

Other embodiments of the present disclosure relate to methods of reducing clogging in an exhaust line of a sub-atmospheric chemical vapor deposition (SACVD) system. Exhaust gases from a reaction chamber in the SACVD system are channeled through a catalytic apparatus prior to the exhaust gases entering the exhaust line. The catalytic apparatus contains a catalyst that decomposes ozone to oxygen. As a result, the formation of powder/particles which can cause clogging is reduced.

Finally, some embodiments of the present disclosure relate to methods for reducing the formation of silicon dioxide in an exhaust line of a sub-atmospheric chemical vapor deposition (SACVD) system. The decomposition of ozone to oxygen is catalyzed in a catalytic apparatus upstream of the exhaust line. The reduced amount of ozone, as well as the reduced concentration of ozone, results in less reaction with TEOS to form silicon dioxide in the exhaust line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a silicon oxide insulating layer on a semiconductor wafer substrate, comprising:
    pumping a silicon precursor and ozone into a reaction chamber of a sub-atmospheric chemical vapor deposition (SACVD) system;
    reacting the silicon precursor and the ozone to form the silicon oxide insulating layer on the semiconductor wafer substrate; and
    channeling exhaust gases containing ozone and the silicon precursor out of the reaction chamber and through a catalytic apparatus prior to the exhaust gases entering an exhaust line;
    wherein the catalytic apparatus contains a catalyst that decomposes ozone to oxygen; and
    wherein the catalyst comprises an oxide of Mn, Ti, Zn, or Fe, or wherein the catalyst comprises a metal or an oxide of Pt, Pd, Ru, Cu, W, Ag, Sn, Ni, Au, Ir, Rh, Ce, Cr, Co, Al, V, Mo, Mg, or Zr.

2. The method of claim 1, wherein the exhaust gases include ozone and tetraethyl orthosilicate.

3. The method of claim 1, wherein the temperature of the exhaust gases within the exhaust line is from about 60° C. to about 200° C.

4. The method of claim 1, wherein the ozone concentration in the exhaust line is less than 3%.

5. The method of claim 1, wherein the residence time of the exhaust gases within the catalytic apparatus is less than 1 second.

6. The method of claim 1, wherein the catalyst comprises an oxide of Mn, Ti, Zn, or Fe.

7. The method of claim 1, wherein the catalyst comprises a metal or an oxide of Pt, Pd, Ru, Cu, W, Ag, Sn, Ni, Au, Ir, Rh, Ce, Cr, Co, Al, V, Mo, Mg, or Zr.

8. The method of claim 1, wherein a cartridge is inserted into the catalytic apparatus, the cartridge comprising a plurality of walls which together form passages, and the catalyst is in the form of a coating on the walls; and wherein a vertical opening ratio of the cartridge is at least 95%; and wherein at least one wall includes holes along a height thereof, and a hole ratio of the at least one wall is less than 75%.

9. The method of claim 8, wherein the passages have a cross-sectional area comprising the shape of a triangle, rectangle, hexagon, or circle.

10. The method of claim 8, wherein a diameter of the passages is from about 5 mm to about 100 mm.

11. The method of claim 1, wherein a width of the catalytic apparatus is less than a height of the catalytic apparatus.

12. The method of claim 1, wherein the catalytic apparatus has a height of about 10 millimeters to about 200 millimeters.

13. The method of claim 1, wherein the catalytic apparatus is within 10 meters of the exhaust port.

14. A method for reducing the formation of silicon dioxide in an exhaust line of a sub-atmospheric chemical vapor deposition (SACVD) system, comprising:

receiving, in a catalytic apparatus, exhaust gases containing ozone and a silicon precursor from a reaction chamber of the SACVD system;

catalyzing the decomposition of the ozone to oxygen in the catalytic apparatus upstream of the exhaust line; and sending the exhaust gases through the exhaust line to a waste treatment system;

wherein the catalytic apparatus comprises a catalyst; and wherein the catalyst comprises an oxide of Mn, Ti, Zn, or Fe, or wherein the catalyst comprises a metal or an oxide of Pt, Pd, Ru, Cu, W, Ag, Sn, Ni, Au, Ir, Rh, Ce, Cr, Co, Al, V, Mo, Mg, or Zr.

15. The method of claim 14, wherein a cartridge is inserted into the catalytic apparatus, the cartridge comprising a plurality of walls which together form passages, and the catalyst is in the form of a coating on the walls.

16. The method of claim 15, wherein a vertical opening ratio of the cartridge is at least 95%.

17. The method of claim 15, wherein at least one wall includes holes along a height thereof.

18. The method of claim 17, wherein a hole ratio of the at least one wall is less than 75%.

19. A system, comprising:

a reaction chamber for a sub-atmospheric chemical vapor deposition (SACVD) process, the reaction chamber including an exhaust port and at least one gas inlet connected to a source for a silicon precursor and a source for ozone;

an exhaust line for removing exhaust gases through the exhaust port;

a catalytic apparatus positioned outside of the reaction chamber between the exhaust port and the exhaust line, containing a catalyst that decomposes ozone to oxygen; and a waste treatment system downstream of the exhaust line;

wherein the catalyst comprises an oxide of Mn, Ti, Zn, or Fe, or wherein the catalyst comprises a metal or an oxide of Pt, Pd, Ru, Cu, W, Ag, Sn, Ni, Au, Ir, Rh, Ce, Cr, Co, Al, V, Mo, Mg, or Zr.

20. The system of claim 19, wherein the catalyst comprises an oxide of Mn, Ti, Zn, or Fe.

* * * * *